United States Patent
Mangeney et al.

(10) Patent No.: US 8,421,493 B2
(45) Date of Patent: Apr. 16, 2013

(54) PROCESS AND DEVICE FOR CHARACTERISING AN ELECTRIC SIGNAL PROPAGATING IN A SAMPLE

(75) Inventors: Juliette Mangeney, Cachan (FR); Paul Crozat, Les Ulis (FR); Loïc Meignien, Gometz le Chatel (FR); Jean-Michel Lourtioz, Orsay (FR)

(73) Assignees: Universite Paris Sud, Orsay (FR); Centre National de la Recherche Scientifique, Paris (FR)

( * ) Notice: Subject to any disclaimer, the term of this patent is extended or adjusted under 35 U.S.C. 154(b) by 848 days.

(21) Appl. No.: 12/442,178

(22) PCT Filed: Sep. 7, 2007

(86) PCT No.: PCT/FR2007/001446
§ 371 (c)(1),
(2), (4) Date: Oct. 20, 2009

(87) PCT Pub. No.: WO2008/034962
PCT Pub. Date: Mar. 27, 2008

(65) Prior Publication Data
US 2010/0141284 A1 Jun. 10, 2010

(30) Foreign Application Priority Data
Sep. 20, 2006 (FR) ..................................... 06 08214

(51) Int. Cl.
*G01R 31/26* (2006.01)
(52) U.S. Cl.
USPC .. 324/760.01; 324/751; 324/752; 324/754.22; 324/754.23; 356/926; 356/927; 356/322; 356/323
(58) Field of Classification Search ................. 324/751, 324/752, 753, 754.22, 754.23; 356/926, 356/927, 339, 340, 322, 323
See application file for complete search history.

(56) References Cited

U.S. PATENT DOCUMENTS

| 4,681,449 A | 7/1987 | Bloom et al. |
| 5,767,688 A * | 6/1998 | Takahashi et al. ....... 324/754.23 |

(Continued)

FOREIGN PATENT DOCUMENTS

| EP | 0 921 404 | 6/1999 |
| WO | 97/45747 | 12/1997 |

OTHER PUBLICATIONS

L. Joulaud et al., "A 210-GHz Bandwidth Electrooptic Sampler for Large Signal Characterization of InP-Based Components", IEEE Photonics Technology Letters, Dec. 2005, pp. 2679-2681, vol. 17, No. 12, IEEE.

(Continued)

*Primary Examiner* — Huy Q Phan
*Assistant Examiner* — Thang Le
(74) *Attorney, Agent, or Firm* — Young & Thompson

(57) ABSTRACT

A method for characterizing an electric signal (10), includes the propagation of a first light beam (18) through an electro-optical medium (17) in a first propagation direction, wherein at least one optical property of the medium changes when it is submitted to an electrical field, and the propagation of a second light beam (19) through the electro-optical medium in a second propagation direction different from the first direction. For each light beam, a measurement of a variation in an optical property of the light beam (18; 19) due to the propagation of the beam in the medium (17) is used for determining the propagation direction (20) of an electric signal (10) submitting the medium to an electrical field. A device for implementing the method, and an electro-optical probe implemented in the device are also disclosed. Applicability: electro-optical sampling of a component, characterization of electric pulses in guided structures.

37 Claims, 2 Drawing Sheets

U.S. PATENT DOCUMENTS

Figure 1:
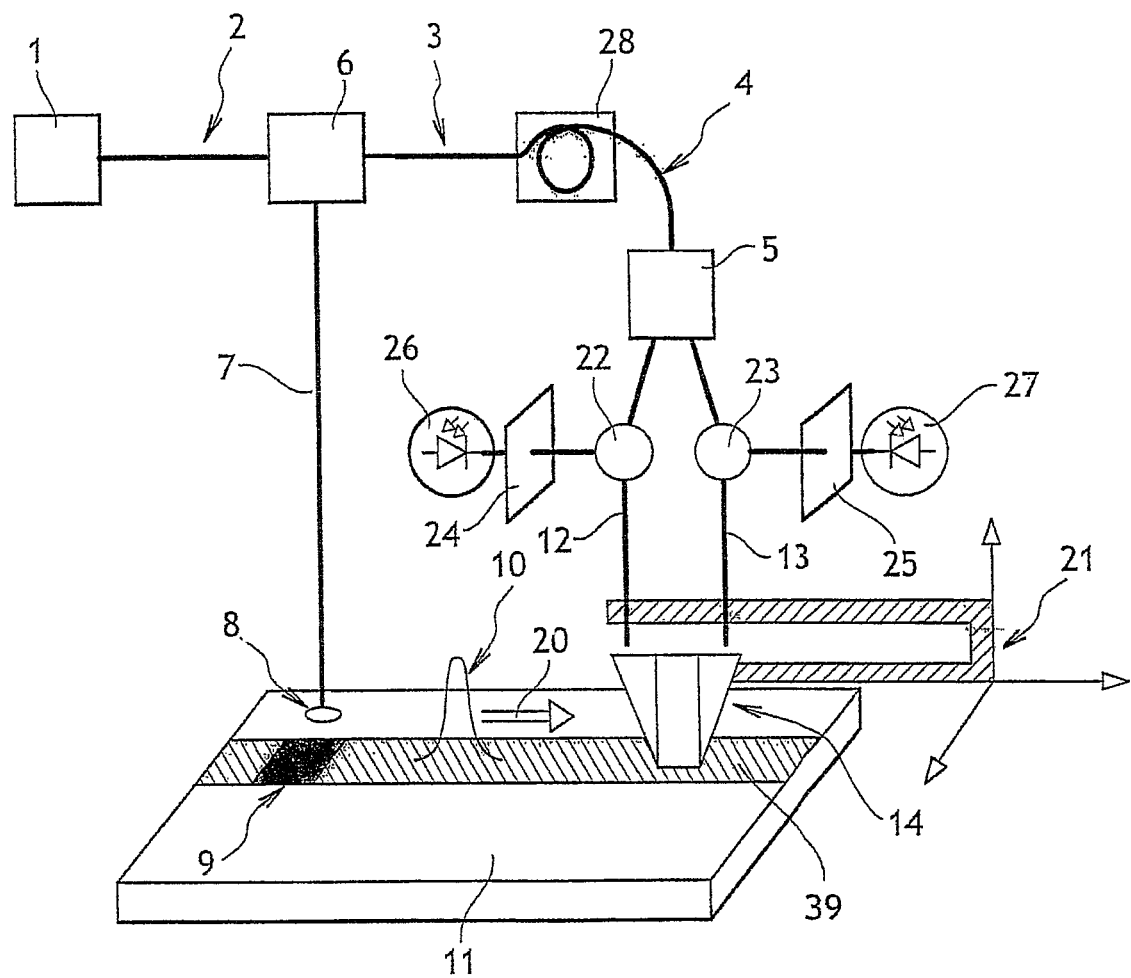

| | | | | |
|---|---|---|---|---|
| 6,011,402 | A * | 1/2000 | Kuo et al. | 324/750.22 |
| 6,337,565 | B1 * | 1/2002 | Ito et al. | 324/96 |
| 7,659,981 | B2 * | 2/2010 | Lo et al. | 356/369 |
| 2002/0017913 | A1 | 2/2002 | Yagi et al. | |

OTHER PUBLICATIONS

Janis A. Valdmanis et al., "Subpicosecond Electrooptic Sampling: Principles and Applications", IEEE Journal of Quantum Electronics, Jan. 1986, pp. 69-78, vol. QE-22, No. 1, IEEE.

S. A. Shah et al., "Separating temporally-overlapped waveforms with electrooptic sampling", Optical and Quantum Electronics, 1996, pp. 953-960, vol. 28, Chapman & Hall.

U. D. Keil et al., "Ultrafast Pulse Generation in Photoconductive Switches", IEEE Journal of Quantum Electronics, Sep. 1996, vol. 32, No. 9, IEEE.

C. Winnewisser et al., "Electro-optic detection of THz radiation in LiTaO3, LiNbO3, and ZnTe", Appl Phys. Lett., Jun. 9, 1997, pp. 3069-3071, vol. 70, No. 23, American Institute of Physics.

PCT International Search Report, dated Mar. 14, 2008 and issued in corresponding PCT International Patent Application No. PCT/FR2007/001446.

French Patent Office Preliminary Search Report, dated May 14, 2007 and issued in corresponding French Patent Application No. 685281.

* cited by examiner

PROCESS AND DEVICE FOR CHARACTERISING AN ELECTRIC SIGNAL PROPAGATING IN A SAMPLE

TECHNICAL FIELD

The present invention relates to an electro-optic sampling process and device for characterising an electric signal, and in particular for determining the direction of propagation of the electric signal. It also relates to an electro-optic probe used in a device according to the invention.

The field of application of the invention is electro-optic sampling and the measurement and characterisation of electric signals, in particular of ultra-short electric pulses propagating in guided structures.

PRIOR ART

Fields such as optical communications and microelectronics require increasingly faster components. The present means in the field of communications have rates of 10 gigabits per second in single-channel laid lines. Rates of 40 gigabits per second are already proven in research and are beginning to be installed and rates of 80 gigabits per second are foreseen.

The use of conventional measurement equipment for measuring electric signals in electronic and optoelectronic components is limited to frequencies below 210 gigahertz with network analyzers and to frequencies below 110 gigahertz with oscilloscopes, which corresponds to a temporal resolution of a few picoseconds.

For higher frequencies, it is possible to use measuring equipment based on electro-optic sampling. The principle of the electro-optic sampling technique is widely described in the literature, in particular in the documents [1] to [4] referenced on the last page. It is based on the Pockels effect, i.e. on a change of optical properties of an electro-optic crystal under the effect of an electric field. An electro-optic crystal is placed for example close to a sample in which an electric signal is propagating. The refractive indices of the crystal change in the presence of the electric field. A measuring light beam passing through the crystal has its polarisation changed due to the index variation of the crystal induced by the electric field. A measurement of this variation of polarisation makes it possible to derive the value of the applied electric field. In a device such as that described in document [2], the measuring light beam propagates in the crystal in a direction perpendicular to the direction of propagation of the electric signal.

However, the present day electro-optic sampling devices do not make it possible to determine the direction of propagation of an electric signal. Such devices therefore have the disadvantage of not being able to distinguish between two signals propagating in opposite directions. They do not therefore make it possible to distinguish between, on the one hand, an original signal propagating in a circuit and, on the other hand, echo signals or parasitic rebounds of the original signal. These echoes or rebounds are generally emitted as a result of an impedance mismatch phenomenon in the circuit and generally propagate in the direction opposite to that of the original signal. The characterisation of these parasitic effects is important because these effects interfere with the original signal.

Moreover, present day fibre-based electro-optic sampling devices are limited in frequency.

The purpose of the invention is to propose a process and a device for characterising an electric signal and an electro-optic probe used in a device according to the invention, making it possible to determine the direction of propagation of an electric signal, and moreover able to exhibit at least one of the following advantages:
  the possibility of determining the presence of parasitic echoes and of characterising these echoes, and
  an improved temporal resolution with respect to the prior art of fibre-based electro-optic systems.

DESCRIPTION OF THE INVENTION

This objective is achieved with a process for characterising an electric signal, comprising:
  a propagation of a first light beam through an electro-optic medium in a first direction of propagation, at least one optical property of the medium varying when it is subjected to an electric field,
  a propagation of a second light beam through the electro-optic medium in a second direction of propagation different from the first direction,
  for each of the light beams, a measurement of a variation of an optical property of the light beam due to the propagation of the beam in the electro-optic medium, and
  a determination, from the measurements, of a direction of propagation of an electric signal subjecting the electro-optic medium to an electric field.

In one embodiment, the propagations of the two light beams through the electro-optic medium are substantially simultaneous, such that the electric signal modifies at least one optical property of the electro-optic medium during the propagations of the light beams through the electro-optic medium.

It is also possible to envisage another embodiment in which the propagations of the two light beams through the electro-optic medium are spaced temporally. In this case, the same electric signal, for which it is sought to determine the direction of propagation, propagates twice in succession in the proximity of the electro-optic medium, in such a way as to modify at least one optical property of the electro-optic medium during each of the propagations of the light beams through the electro-optic medium.

The determination of the direction of propagation of the electric signal uses the fact that the variation of an optical property for each light beam depends on the direction of propagation of the beam through the medium with respect to the direction of propagation of the electric signal.

Preferably, the direction of propagation of one of the light beams is substantially collinear with the direction of propagation of the electric signal. In this way, the direction of propagation of one of the light beams is parallel with the direction of propagation of the electric signal. The geometry of the problem and the determination of the direction of propagation of the electric signal are then simplified.

In the same way, the first and second directions of propagation are preferentially substantially opposite. This way, the directions of propagation of the light beams are parallel. The geometry of the problem and the determination of the direction of propagation of the electric signal are then simplified. In this variant, the two beams can propagate in the medium along substantially merged paths.

At least one of the light beams can consist of an optical pulse. The process according to the invention can moreover comprise a generation of the two light beams by a same optical pulse. The shorter the pulse is, the smaller is the temporal resolution of a measurement, that is to say the better it is (high temporal resolution).

One of the properties of the medium varying when it is subjected to an electric field can be for example a refractive index of the medium. The properties of the medium varying when it is subjected to an electric field can, for example in the case of a birefringent crystal, comprise several refractive indices. In general, an electric field modifies the permittivity tensor of an electro-optic medium, which can influence a refractive index of the medium and other properties as well.

For at least one of the light beams, the measurement can comprise a measurement of a variation of the polarisation of the light beam or directly a measurement of a variation of intensity of the beam (a variation of index in fact being able to modify the transmittance of the electro-optic medium which results in a variation of intensity of the transmitted beam). The process according to the invention can moreover comprise a conversion of the variation of polarisation of the light beam into a variation of intensity of the light beam, for example by means of a polarizer.

The process according to the invention can moreover comprise a generation of the propagating electric signal, for example allowing a triggering of the propagation of the electric signal in a sample such as a printed circuit. The generation of the electric signal can comprise a conversion of an optical triggering pulse into the electric signal.

The process according to the invention can moreover comprise a generation of the optical triggering pulse and at least one of the light beams (preferably both of them) by the same initial optical pulse. The process according to the invention can moreover also comprise a variation of a delay between the generation of the electric signal and the propagations of the light beams through the electro-optic medium.

The electric signal which propagates results in the propagation of an electric field in the electro-optic medium. The process according to the invention can moreover comprise a determination of a value of the electric signal or of the electric field. During its propagation, the electric field causes at least one optical property of the medium to vary. When the light beams propagate in the medium, the variation of the optical property of the medium can cause an optical property of the first light beam and of the second light beam to vary. Thus, the first and second light beams interact with the electric signal via the electro-optic medium. The interaction time of one of the beams with the electric field or signal depends in particular on the angle (or on the difference) between the direction of propagation of said beam and the direction of propagation of the electric signal. The measurement of the variation of the optical property of one of the beams (typically the polarisation) makes it possible to determine the value of the signal or of the field at the time when the beam interacts with the signal via the medium. The process according to the invention can moreover comprise a determination of a temporal profile of the electric signal or field. The determination of the temporal profile can be carried out for example by successive propagations of the first or second beam through the medium, in the form of a plurality of optical pulses. Each optical pulse interacts with a different part of the electric signal and thus makes it possible to determine different values of the electric signal or field over the course of time.

The process according to the invention can moreover comprise a characterisation of parasitic echoes and/or of rebounds of the electric signal. The characterisation of an echo (or of a rebound) can comprise the determination of the value of the electric field of the echo, the determination of a temporal profile of the echo, the determination of the delay between the echo and the electric signal at the origin of the echo, or the determination of the direction of propagation of the echo.

According to yet another aspect of the invention, a device for characterising an electric signal is proposed, comprising:

means for propagating a first light beam through an electro-optic medium in a first direction of propagation, at least one optical property of the medium varying when it is subjected to an electric field, means for propagating a second light beam through the electro-optic medium in a second direction of propagation different from the first direction, for each of the light beams, means for measuring a variation of an optical property of the light beam due to the propagation of the beam in the electro-optic medium, and means for determining, from the variation measurements, a direction of propagation of an electric signal subjecting the electro-optic medium to an electric field.

The device can be arranged such that the first and second directions of propagation of the light beams are substantially opposite.

The device can be arranged such that the two light beams have substantially merged propagation paths in the medium.

The device can be arranged such that the direction of propagation of one of the light beams is substantially collinear with the direction of propagation of the electric signal.

The device according to the invention can moreover comprise means for generating the first and the second light beams from a same optical pulse. These means make it possible to limit a possible time shift between the two beams.

For at least one of the light beams, the measuring means can comprise means for measuring a variation of the polarisation of the light beam, or means for measuring a variation of intensity of the beam. The device according to the invention can moreover comprise means for converting a variation of polarisation of the light beam into a variation of intensity of the light beam.

The device according to the invention can moreover comprise means for determining a value of the electric signal or field, and/or means for determining a temporal profile of the electric signal or of the induced electric field.

The device according to the invention can moreover comprise means for characterising parasitic echoes and/or rebounds of the electric signal.

The electro-optic medium can comprise an electro-optic crystal, preferably a crystal of lithium tantalite ($LiTaO_3$), of zinc telluride (ZnTe) or of (diethyl amino)sulphur trifluoride (DAST).

The refractive index of the electro-optic medium at an optical frequency of at least one of the light beams can be substantially equal to the refractive index of the electro-optic medium at a frequency of the electric signal.

The device according to the invention can moreover comprise means for generating the propagating electric signal, for example in order to excite a sample such as a printed circuit. The means for generating the electric signal can comprise means for converting an optical triggering pulse into the electric signal. The device according to the invention can moreover comprise means for generating the optical triggering pulse and at least one of the light beams from the same initial optical pulse. The device according to the invention can moreover comprise means for varying a delay between the generation of the propagating electric signal and the propagations of the light beams through the medium.

The electric signal can propagate in a sample to be characterised such as a printed circuit.

Finally, the electro-optic medium can be part of an electro-optic probe provided so as to be placed close to a sample that has to be characterised and in which the electric signal propagates.

According to yet another aspect of the invention, an electro-optic probe used in a device according to the invention is proposed, characterized in that it comprises:
- an electro-optic medium of which at least one optical property varies when it is subjected to an electric field,
- means for collecting a first light beam and a second light beam having substantially the same direction of propagation towards the electro-optic probe, and
- means such that the first light beam and the second light beam propagate through the electro-optic medium in different directions of propagation.

The electro-optic probe can be arranged such that the directions of propagation of the light beams through the medium are substantially opposite.

The electro-optic probe can be arranged such that the two beams have substantially merged propagation paths through the medium.

The electro-optic probe can comprise two prisms situated along a first lateral face and a second lateral face of the electro-optic medium respectively, the prisms being arranged substantially symmetrically with respect to a plane passing through the medium.

The electro-optic medium can have substantially the shape of a right-angled parallelepiped and can comprise two opposite faces called upper and lower and substantially perpendicular to the lateral faces, the lower face being provided so as to be placed close to a sample in which an electric signal propagates, and each prism can comprise:
- a first face along one of the lateral faces,
- a second face provided for collecting the first or the second light beam, and forming with said one of the lateral faces a substantially right angle at the upper face side,
- a third face forming with said one of the lateral faces an acute angle at the lower face side, the third face being arranged in order to reflect the first or the second beam from the second face towards the electro-optic medium or vice-versa. The electro-optic probe can be arranged such that the direction of propagation of one of the light beams through the medium is substantially parallel with the lower face of the medium.

DESCRIPTION OF THE FIGURES AND EMBODIMENTS

Figure 2:
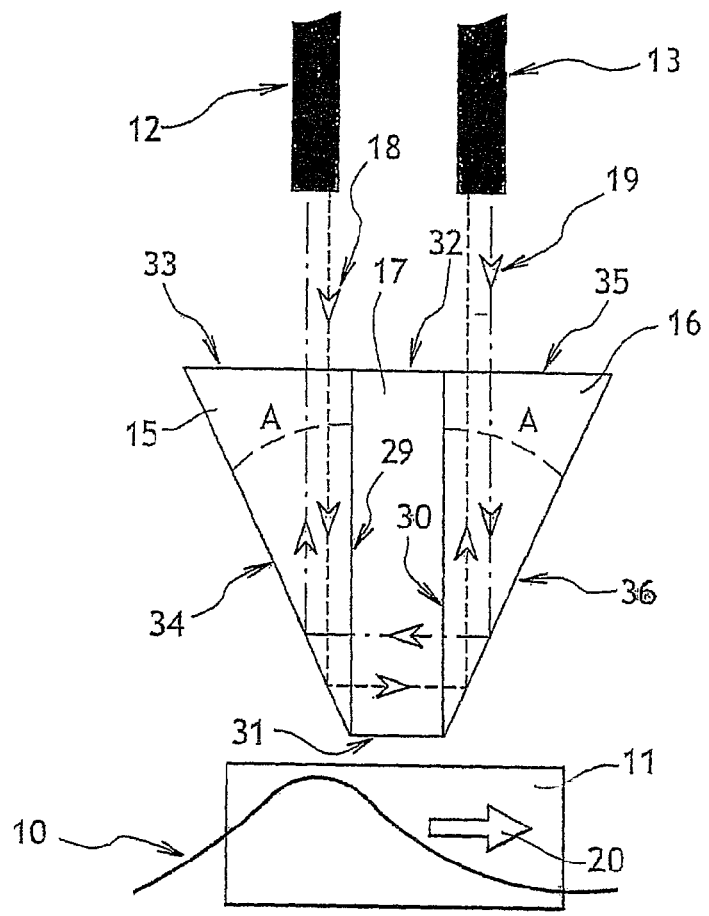
Figure 3:
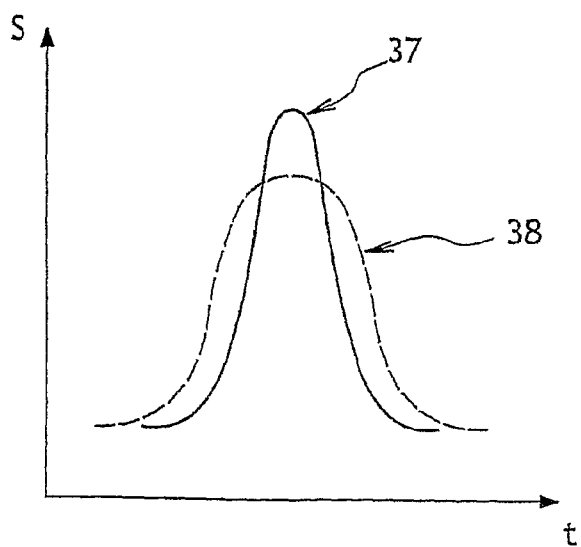

Other advantages and features of the invention will become apparent on reading the detailed description of implementations and embodiments that are in no way limitative, and the following attached drawings:

FIG. 1 is a diagrammatic illustration of a preferred embodiment of a device according to the invention, FIG. 2 is an enlarged view of an electro-optic probe of the device shown in FIG. 1, and FIG. 3 shows two signals measured by a device according to the invention.

A preferred embodiment of the device according to the invention, implementing a process according to the invention, will be described with reference to the FIGS. 1 to 3.

The device comprises means 1, 5 for emitting a first and a second light beam 18, 19. An electro-optic probe 14 comprising an electro-optic crystal 17 is arranged to collect the emitted beams and to make them propagate through the crystal 17 in two different directions of propagation. The electro-optic probe is provided so as to be situated close to a sample 11 such as an integrated circuit, in which an electric signal 10 propagates. Means 24-27 for carrying out measurements on the beams having passed through the crystal make it possible to determine the direction of propagation 20 of the electric signal in the circuit.

In general, the electric signal propagates along a line 39 of the integrated circuit 11 to be characterised. The determination of the direction of propagation 20 of the electric signal therefore consists of a determination of the direction of propagation of the electric signal along the line 39.

The general principle of the invention is as follows. The electric signal 10 which propagates in the circuit 11 induces a propagation of an electric field in the electro-optic medium 17. During its propagation, the electric field causes at least one optical property of the medium 17, such as its refractive index, to vary. When the light beams 18, 19 propagate in the medium 17, the variation of the optical property of the medium causes an optical property of the first 18 and/or of the second 19 light beam to vary, in particular their polarisation. The interaction time of one of the beams with the electric field depends in particular on the angle between the direction of propagation of said beam and the direction of propagation of the electric signal. The directions of propagation of the beams in the medium are different, such that the interaction times of each beam with the electric field are different. The variation of the optical property of the first beam over time is therefore different from that of the second beam. The difference between these variations makes it possible to determine the direction of propagation 20 of the electric signal 10.

The means for emitting the first and second light beams comprise a laser source 1, connected via an optical fibre 2 to a first optical coupler 6. The dispersion introduced by the optical fibres is managed: it is possible for example to use optical fibres for which the dispersion is low at the wavelengths and powers conveyed, or means of compensation of the of dispersion phenomena (such as negative dispersion fibres). The laser 1 delivers optical pulses having a duration of 200 femtoseconds, a wavelength of 1550 nanometers and with a repetition rate of 14 megahertz. The coupler 6 separates each pulse into an optical triggering pulse on a first channel and a an optical analysis pulse on a second channel.

In the first channel, the optical triggering pulse is carried along an optical fibre 7, the end of which orientated towards the circuit 11 is provided with a lens 8, and is then converted by an optical-electrical converter 9 into an electric signal (typically a Gaussian electric pulse). The optical pulse focussed by the lens 8 onto the converter 9 therefore makes it possible to trigger a propagation of the electric signal 10 in a part 39 of the integrated circuit 11. The means for carrying out this conversion comprise a fast photoconductor arranged such that the electric signal is as short as possible. The photoconductor has preferably been irradiated with ions of the active semiconductor layer of the integrated circuit, such that it is as fast as possible and the electric signal is as short as possible. In fact, the shorter the electric signal 10 is, the more it is possible to characterise the response of the circuit 11 at a high frequency.

In the second channel, the optical analysis pulse is directed via optical fibres 3, 4 to a second coupler 5 and is then is separated by the coupler 5 into a first and a second optical pulse corresponding to the first and second light beams respectively. The first optical pulse 18 is directed to the crystal 17 via a first fibre circulator 22 and a first flexible optical fibre 12 optically coupled to the electro-optic probe 14. Similarly, the second optical pulse 19 is directed to the crystal 17 via a second fibre circulator 23 and a second flexible optical fibre 13 optically coupled with the electro-optic probe 14. As the optical pulses 18, 19 are generated simultaneously by the same laser pulse, they propagate virtually simultaneously inside the electro-optic crystal of the probe 14.

The electro-optic probe 14 consists of a prismatic head comprising the electro-optic crystal 17 placed between a first prism 15 and a second prism 16. The assembly of the prisms can be carried out by a method such as bonding by molecular adhesion or using an optical adhesive. In the case of the optical adhesive, the adhesive used has an index substantially identical to that of the electro-optic crystal. The crystal preferably consists of a crystal of ZnTe. The prisms are formed from a material conventionally used in optics, such as a type BK7 glass. The electro-optic crystal substantially has the shape of a right-angled parallelepiped. The two prisms are respectively situated against a first lateral face 29 and a second lateral face 30 of the crystal. These two lateral faces are opposite, such that the probe has a plane of symmetry passing through the crystal and between the two prisms. The crystal moreover has a face called the upper face 32 orientated towards the flexible fibres 12, 13, and a lower face 31 provided so as to be placed close to a part 39 of the integrated circuit 11. The lower 31 and upper 32 faces are opposite and substantially perpendicular to the two lateral faces 29, 30.

Each prism moreover has:
a first face along one of the lateral faces 29 or 30,
a second face 33 or 35 provided for collecting the first light beam 18 or second light beam 19, and forming with said one of the lateral faces 29 or 30 a substantially right angle at the upper face 32 side,
a third face 34 or 36 forming with said one of the lateral faces 29 or 30 an acute angle A at the lower face 31 side, said third face being arranged to reflect the first 18 or the second 19 beam from the second face 33 or 35 towards the electro-optic medium 17 or vice-versa.

The second faces of the two prisms are oriented towards the fibres 12, 13, and are both substantially perpendicular to the directions of propagation of the beams 18, 19 towards the electro-optic probe 14. A anti-reflection treatment has been deposited on the second face 33, 35 of each prism.

On leaving the fibres 12, 13, the optical pulses 18, 19 both propagate substantially perpendicularly with respect to the plane of the faces 32, 33, 35 of the crystal and of the prisms. The first optical pulse 18 leaves the first fibre 12, is collected by the second face 33 of the first prism 15, is reflected towards the crystal 17 by the third oblique face 34 of the first prism 15, penetrates into the crystal through the first lateral face 29 of the crystal, passes through the crystal, leaves the crystal through the second lateral face 30 of the crystal, is reflected towards the second face 35 of the second prism 16 by the third oblique face 36 of the second prism 16, and penetrates into the inside of the second fibre 13.

The second optical pulse 19 follows the reverse path. It therefore leaves the second fibre 13, passes through the crystal from the second lateral face 30 to the first lateral face 29, and penetrates into the first fibre 12.

Thus, the prisms redirect the pulses 18, 19 which have substantially a same direction of propagation before penetrating into the electro-optic probe, such that the pulses 18, 19 propagate through the crystal in opposite directions.

The angle A is less than or equal to 47°, such that the reflection of the pulses 18, 19 on the oblique faces 34, 36 is total. Typically, the pulses 18, 19 pass through the crystal over a width of about one hundred micrometers, and pass through each prism over a width of approximately 200 micrometers and over a height of approximately two millimeters.

In FIG. 2, the paths of the pulses 18, 19 are shown spaced for better clarity of the figure. In reality, the paths of the pulses 18, 19 are preferably substantially merged.

The fibres 12, 13 and the electro-optic probe are arranged such that the pulses 18, 19 propagate as close as possible and substantially parallel to the plane of the lower face 31 of the crystal 17. A plate having three axes of translational movement 21 makes it possible to displace the distal ends (i.e. those orientated towards the circuit 11) of the fibres 12, 13 through which the pulses 18, 19 emerge and the electro-optic probe 14 together in an integral manner. The plate 21 thus makes it possible to position the lower face 31 close to a part 39 of the circuit 11, such that the electric signal 10, generated by the same laser pulse as the pulses 18, 19, propagates under the face 31 of the electro-optic probe 14 at the same time as the pulses 18, 19 pass through the crystal, and such that the electric signal 10 has a direction of propagation substantially collinear with the direction of propagation of one of the optical pulses 18.

In propagating through the circuit 11 situated close to the electro-optic probe, the electric signal subjects the crystal to an electric field. The refractive indices of the crystal vary, and the polarisation of each of the first and second pulses 18, 19 vary during their passage through the crystal 17.

After having passed through the crystal 17, the first pulse 18 penetrates into the inside of the second fibre 13 through its distal end. The second fibre circulator 23 directs the first pulse 18 towards a photodiode 27, preceded by a polarising system 25. Similarly, after having passed through the crystal 17, the second pulse 19 penetrates inside the first fibre 12 through its distal end. The first fibre circulator 22 directs the pulse 19 towards a photodiode 26, preceded by a polarising system 24. The polarising system 25, 24 makes it possible to convert the variation of polarisation of the first or of the second pulse 18 or 19 respectively into a variation of light intensity, measured by the photodiode 27 or 26 respectively.

The photodiodes 26, 27 therefore make it possible to carry out two simultaneous measurements: in a first measurement, the optical pulse 18 propagating through the crystal and the electric signal propagating close to the lower face 31 of the crystal have the same direction of propagation; and in a second measurement, the optical pulse 19 propagating through the crystal and the electric signal propagating close to the lower face 31 of the crystal have opposite directions of propagation.

The electric signal 10 which propagates induces a propagation of an electric field in the electro-optic crystal 17. During its propagation, the electric field causes the refractive indices of the crystal 17 to vary. When the light beams 18, 19 propagate in the medium, the variation of refractive index causes the polarisations of the first and of the second light beams to vary. Thus, the first light beam 18 and second light beam 19 interact with the electric signal via the electro-optic crystal 17. The interaction time of one of the beams with the electric field or signal depends in particular on the angle between the direction of propagation of said beam and the direction of propagation of the electric signal. The variation of the polarisation of one of the beam and therefore the intensity signal over the course of time measured on the beam depends on this interaction time and therefore on the direction of propagation of the beam. Moreover, the measurement of the variation of the polarisation is proportional to the value of the signal or of the field at the time when the beam interacts with the signal via the medium.

The signals S measured as a function of time t are shown in FIG. 3 for both measurements. Preferably, the photodiodes 26, 27 are positioned as close as possible to the crystal 17 in order to limit the noise on the measured signals. The use of synchronous detections also makes it possible to reduce this noise.

For the first measurement, the signal measured by the photodiode 27 is not distorted. For the second measurement, the signal 28 measured by the photodiode 26 is widened in time because of the counter-propagative propagation vectors of the optical pulse 19 and of the electric signal 10. An electronic unit for processing and analyzing the measurements makes it possible to determine the direction of propagation of the electric signal 10. The comparison of the two measurements therefore makes it possible to determine the direction of propagation 20 data of the electric signal 10: the electric signal propagates in the same direction as the optical pulse for which the measured variation of polarisation is greatest and the least widened in time. The value of the signal 10 and of the electric field is that measured by the photodiode 27 over an optical pulse 18 propagating in the same direction as the electric signal 10.

The determination of the direction of propagation uses the fact that the result of a measurement is different if the electric signal 10 and the light beam 18 or 19 propagate in the same direction or propagate in opposite directions. In a configuration such as that of a device according to document [2], the result of the measurement is insensitive to the direction of propagation of the electric signal since the measuring light beam and the electric signal are perpendicular.

The device according to the invention moreover comprises a fibre delay line 28, making it possible to vary a delay between the generation of the propagating electric signal 10 and the propagations of the optical pulses 18, 19 through the crystal. A variation of this delay makes it possible, for example, using the processing and analysis unit:

- to determine the temporal profile of the electric signal 10,
- to sample the response of the circuit 11 to be tested and thus to determine the temporal electric response of the circuit, or
- to characterise parasitic echoes or rebounds of the electric signal due, for example, to impedance mismatch phenomena in the circuit 11.

The characterisation of an echo (or of a rebound) typically comprises the determination of the value of the electric field of the echo, the determination of a temporal profile of the echo, the determination of the delay between the echo and the electric signal 10 at the origin of the echo, or also the determination of the direction of propagation of the echo. The determination of the direction of propagation of the echo is carried out in the same way as the determination of the direction of propagation of the electric signal 10, using the two light signals 18, 19.

The crystal 17 is preferably chosen such that its refractive index is substantially the same at the optical frequency of the beam 18 passing through the crystal (corresponding to the wavelength of the beam 18) and at a frequency of the electric signal 10 (typically the Fourier transform of the electric signal, of the order of terahertz). Thus, the pulse 18 propagates in the crystal with substantially the same speed of propagation as the electric field which is induced in the crystal by the propagation of the electric signal. Thus, the temporal resolution and the bandwidth of the device according to the invention substantially depend only on the duration of the optical pulse 18. A device according to the invention can typically have a bandwidth greater than 300 gigahertz, and a temporal resolution of the order of a few femtoseconds.

In a configuration such as that of a device according to document [2], the optical pulse propagating through the crystal and the electric signal are perpendicular. The electric signal induces an electric field propagating in the crystal. Throughout the longitudinal passage of the optical pulse, the electric field which propagates laterally in the crystal is averaged. The temporal resolution of such a configuration is therefore limited by the interaction time between the optical pulse and the electric field present in the crystal, and is typically 2.2 ps for a crystal thickness of 100 micrometers. This is equivalent to a bandwidth of 220 gigahertz.

Of course the invention is not limited to the examples which have just been described and numerous adjustments can be made to these examples without exceeding the scope of the invention.

A variant of the described embodiment can be imagined in which the measurements of variation of an optical property are not carried out simultaneously for the two light beams. Means such that a same electric signal propagates several times in succession can make it possible to carry out, at two different times, a first and a second measurement of variation of an optical property of the first or of the second light beam respectively.

Moreover, the directions of propagation of the first and second light beams through the electro-optic medium are not necessarily both parallel with the direction of propagation of the electric signal, but can propagate in directions different from that of the electric signal. It is possible, for example, to imagine a configuration in which one of the light beams only has a first component of propagation collinear with the direction of propagation of the electric signal (a second component of propagation of this beam being substantially perpendicular to the direction of propagation of the signal), and in which the other light beam has only one component of propagation opposed to said first component (another component of propagation of this beam being substantially perpendicular to the direction of propagation of the signal). In this case, the interaction times of the two beams with the electric field induced by the electric signal are different. The variations of polarisations of the first and of the second beams are different, which makes it possible to determine the direction of propagation of the electric signal.

Finally, a device or a process according to the invention is not limited to the characterisation of an electric signal propagating in a sample situated close to an electro-optic medium through which the first and second light beams propagate but can also be applied in order to characterise and to determine the direction of propagation of an electric signal propagating directly in the electro-optic medium.

REFERENCES

Document [1]: Patent Application US 2002/0 017 913 A1
Document [2]: "A 210-GHz Bandwidth Electrooptic Sampler for Large Signal Characterization of InP-Based Components", IEEE Photonics Technology Letters, vol. 17, no. 12, December 2005
Document [3]: « Subpicosecond Electrooptic Sampling: Principles and Applications »,, IEEE Journal of Quantum Electronics, vol. QE-22, no. 1, January 1986
Document [4]: patent U.S. Pat. No. 4,681,449

The invention claimed is:

1. Process for characterising an electric signal (10), comprising:
   a propagation of a first light beam (18) through an electro-optic medium (17) in a first direction of propagation, at least one optical property of the medium varying when it is subjected to an electric field,
the process being characterized in that it furthermore comprises:
   a propagation of a second light beam (19) through the electro-optic medium in a second direction of propagation different from the first direction, for each of the light beams, a measurement of a variation of an optical property of the light beam (18; 19) due to its propagation in the electro-optic medium 17), and a determination, from the measurements, of a direction of propagation (20) of the electric signal (10) subjecting the electro-optic medium (17) to an electric field.

2. Process according to claim 1, characterized in that the propagations of the two light beams through the electro-optic medium are substantially simultaneous, such that the electric signal modifies at least one optical property of the electro-optic medium during the propagations of the light beams through the electro-optic medium.

3. Process according to claim 1, characterized in that in the propagations of the two light beams through the electro-optic medium are spaced temporally, the electric signal propagating twice in succession in such a way as to modify at least one optical property of the electro-optic medium during each of the propagations of the light beams through the electro-optic medium.

4. Process according to claim 1, characterized in that the first and second directions of propagation are substantially opposite.

5. Process according to claim 4, characterized in that the two beams propagate in the medium along substantially merged paths.

6. Process according to claim 1, characterized in that the direction of propagation of one of the light beams (18) is substantially collinear with the direction of propagation (20) of the electric signal (10).

7. Process according to claim 1, characterized in that at least one of the light beams (18; 19) consists of an optical pulse.

8. Process according to claim 7, characterized in that it comprises a generation of the two light beams (18; 19) by a same optical pulse.

9. Process according to claim 1, characterized in that the properties of the medium (17) varying when it is subjected to an electric field comprise at least one refractive index of the medium.

10. Process according to claim 1, characterized in that, for at least one of the light beams (18; 19), the measurement comprises a measurement of a variation of a polarization of the light beam or a measurement of a variation of intensity of the beam.

11. Process according to claim 10, characterized in that it comprises a conversion of the variation of polarization of the light beam into a variation of intensity of the light beam.

12. Process according to claim 1, characterized in that it comprises a generation of the propagating electric signal (10).

13. Process according to claim 12, characterized in that the generation of the electric signal comprises a conversion of an optical triggering pulse into the electric signal (10).

14. Process according to claim 13, characterized in that it comprises a generation of the optical triggering pulse and of at least one of the light beams by a same initial optical pulse.

15. Process according to claim 12, characterized in that it comprises a variation of a delay between the generation of the electric signal and the propagations of the light beams through the electro-optic medium.

16. Process according to claim 1, characterized in that it comprises a determination of a temporal profile of the electric signal.

17. Process according to claim 1, characterized in that it comprises a characterisation of parasitic echoes and/or of rebounds of the electric signal.

18. Device for characterising an electric signal, comprising:

means (1, 5, 15, 33, 34) for propagating a first light beam through an electro-optic medium (17) in a first direction of propagation, at least one optical property of the medium (17) varying when it is subjected to an electric field, the device being characterized in that it furthermore comprises:

means (1, 5, 16, 35, 36) for propagating a second light beam through the electro-optic medium (17) in a second direction of propagation different from the first direction, for each of the light beams, means (25, 27; 24, 26) for measuring a variation of an optical property of the light beam (18; 19) due to its propagation in the electro-optic medium (17), and means for determining, from the measurements of variation, a direction of propagation (20) of the electric signal (10) subjecting the medium to an electric field.

19. Device according to claim 18, characterized in that it is arranged such that the first and second directions of propagation of the light beams are substantially opposite.

20. Device according to claim 19, characterized in that it is arranged such that the two light beams have substantially merged propagation paths in the medium.

21. Device according to claim 18, characterized in that it is arranged such that the direction of propagation of one of the light beams (18) is substantially collinear with the direction of propagation (20) of the electric signal (10).

22. Device according to claim 18, characterized in that it comprises means (1, 5) for generating the first (18) and the second (19) light beams from a same optical pulse.

23. Device according to claim 18, characterized in that, for at least one of the light beams, the measuring means comprise means (24, 26; 25, 27) for measuring a variation of a polarization of the light beam (19; 18), or means for measuring a variation of intensity of the beam.

24. Device according to claim 23, characterized in that it comprises means (24; 25) for converting a variation of polarization of the light beam (19; 18) into a variation of intensity of the light beam.

25. Device according to one of the claim 18, characterized in that it comprises means (28) for determining a temporal profile of the electric signal.

26. Device according to claim 18, characterized in that it comprises means (28) for characterising parasitic echoes or rebounds of the electric signal.

27. Device according to claim 18, characterized in that the electro-optic medium comprises an electro-optic crystal of lithium tantalite (LiTaO3), zinc telluride (ZnTe) or (diethyl amino)sulphur trifluoride (DAST).

28. Device according to claim 18, characterized in that a refractive index of the electro-optic medium at an optical frequency of at least one of the light beams is substantially equal to the refractive index of the electro-optic medium at a frequency of the electric signal.

29. Device according to claim 18, characterized in that it comprises of the means (1, 2, 6, 7, 8, 9) for generating the propagating electric signal.

30. Device according to claim 29, characterized in that the means for generating the electric signal comprise means (9) for converting an optical triggering pulse into the electric signal.

31. Device according to claim 30, characterized in that it comprises means (1, 2, 6) for generating the optical triggering pulse and at least one of the light beams from the same initial optical pulse.

32. Device according to claim 29, characterized in that it comprises means (28) for varying a delay between the generation of the propagating electric signal and the propagations of the light beams (18, 19) through the medium (17).

33. Device according to claim 18, characterized in that the electric signal propagates in a sample to be characterised.

34. Device according to claim 18, characterized in that the electro-optic medium (17) is part of an electro-optic probe (14) provided so as to be placed close to a sample (11) in which the electric signal (10) propagates.

35. Device according to claim 34, characterized in that the electro-optic probe (14) comprises:
   the electro-optic medium (17) of which at least one optical property varies when it is subjected to an electric field,
   means (15, 16) for collecting the first light beam and the second light beam having substantially the same direction of propagation towards the electro-optic probe, and
   means (15, 16) such that the first light beam and the second light beam propagate through the electro-optic medium in different directions of propagation.

36. Device according to claim 34, characterized in that the electro-optic probe (14) comprises two prisms (15, 16) situated along a first lateral face (29) and a second lateral face (30) of the electro-optic medium (17) respectively, the prisms being arranged substantially symmetrically with respect to a plane passing through the electro-optic medium (17).

37. Device according to claim 36, characterized in that the electro-optic medium (17) has substantially the shape of a right-angled parallelepiped and in that it comprises two opposite faces called upper (32) and lower (31) and substantially perpendicular to the lateral faces (29, 30), the lower face (31) being provided so as to be placed close to a sample (11) in which the electric signal propagates, and in that each prism comprises:
   a first face along one of the lateral faces (29; 30),
   a second face (33; 35) provided for collecting the first (18) or the second (19) light beam, and forming with said one of the lateral faces (29; 30) a substantially right angle at the upper face (32) side,
   a third face (34; 36) forming with said one of the lateral faces (29; 30) an acute angle at the lower face (31) side, said third face being arranged in order to reflect the first (18) or the second beam (19) from the second face (33; 35) towards the electro-optic medium (17) or vice-versa.

* * * * *

UNITED STATES PATENT AND TRADEMARK OFFICE
CERTIFICATE OF CORRECTION

PATENT NO.       : 8,421,493 B2
APPLICATION NO. : 12/442178
DATED            : April 16, 2013
INVENTOR(S)      : Mangeney et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1063 days.

Signed and Sealed this
Eighth Day of September, 2015

Michelle K. Lee
*Director of the United States Patent and Trademark Office*